(12) United States Patent
Sowlati et al.

(10) Patent No.: US 6,300,837 B1
(45) Date of Patent: Oct. 9, 2001

(54) DYNAMIC BIAS BOOSTING CIRCUIT FOR A POWER AMPLIFIER

(75) Inventors: Tirdad Sowlati, Ossining; Sifen Luo, Hartsdale, both of NY (US)

(73) Assignee: Philips Electronics North America Corporation, New York, NY (US)

( * ) Notice: Subject to any disclaimer, the term of this patent is extended or adjusted under 35 U.S.C. 154(b) by 0 days.

(21) Appl. No.: 09/536,946

(22) Filed: Mar. 28, 2000

(51) Int. Cl.[7] .................................. H03F 3/26; H03F 3/04
(52) U.S. Cl. ......................... 330/296; 330/267; 330/273
(58) Field of Search ................................. 330/267, 273, 330/296

(56) References Cited

U.S. PATENT DOCUMENTS

| | | | |
|---|---|---|---|
| 3,855,540 | * 12/1974 | Leidich | 330/14 |
| 4,638,260 | * 1/1987 | Hamley | 330/296 |
| 4,663,599 | * 5/1987 | Patch | 330/311 |
| 5,548,248 | 8/1996 | Wang | 330/288 |
| 5,844,443 | 12/1998 | Wong | 330/275 |
| 6,147,543 | * 11/2000 | Gailus et al. | 327/355 |

* cited by examiner

Primary Examiner—Robert Pascal
Assistant Examiner—Patricia T. Nguyen
(74) Attorney, Agent, or Firm—Steven R. Biren

(57) ABSTRACT

A power amplifier circuit includes an amplifying transistor and a dc bias circuit for biasing the amplifier transistor to obtain a conduction angle of at least about 180°. The dc bias circuit includes a dynamic bias boosting circuit for increasing the dc bias current provided to the amplifying transistor by the dc bias circuit in direct proportion to an increase in the input signal provided to the power amplifier. The bias boosting circuit permits the power amplifier circuits to operate in Class B or Class AB with improved power output characteristics and reduced power dissipation at low power levels.

5 Claims, 3 Drawing Sheets

DYNAMIC BIAS BOOSTING CIRCUIT FOR A POWER AMPLIFIER

BACKGROUND OF THE INVENTION

The invention is in the field of transistor amplifier circuits, and relates more particularly to a power amplifier circuit having a bias boosting circuit for increasing maximum power output and reducing power dissipation at low power levels.

Amplifiers of this general type are frequently used in high-frequency RF amplifiers, as well as in audio amplifiers and other applications. In order to obtain a linear input-output relationship and high operating efficiency, such amplifiers are typically operated with a conduction angle of about 180° (Class B) or slightly greater (Class AB) to avoid crossover distortion.

Typically, amplifiers of this type require a dc bias circuit to establish the quiescent bias current in the amplifier circuit to ensure operation in the Class B or Class AB mode. In the prior art, bias is typically provided by a fixed current source, as shown in U.S. Pat. No. 5,844,443, or else by an external supply, which can be set to a desired constant value to secure the quiescent current necessary to operate in the desired mode, as shown in U.S. Pat. No. 5,548,248.

However, in amplifiers of the type described above the average current drawn from the supply depends upon the input signal level. As the output power increases so does the average current in both the emitter and the base of the power transistor. This increased average current causes an increased voltage drop in the biasing circuitry and in ballast resistors (which are used to avoid hot-spotting and thermal runaway in transistors using an interdigitated design). This in turn reduces the conduction angle (i.e. the number of degrees out of 360° that the amplifier is conducting), and forces the amplifier deep into Class B or even Class C operation, thereby reducing the maximum power output by about 25%. To avoid this power reduction, the amplifier must have a larger quiescent bias. In prior-art circuitry this inevitably leads to a higher power dissipation at low power output levels and therefore an undesirable tradeoff in operating characteristics.

Accordingly, it would be desirable to have a power amplifier circuit which offers the advantages of optimum maximum output power and reduced power dissipation at low power levels. Additionally, it would be desirable for such a circuit to be simple and compact in design, and economical to manufacture.

SUMMARY OF THE INVENTION

It is therefore an object of the present invention to provide a power amplifier circuit which provides improved maximum output power and less power dissipation at low power levels. It is a further object of the invention to provide a power amplifier circuit which is both simple and compact in design and which is economical to manufacture.

In accordance with the invention, these objects are achieved by a new power amplifier circuit for amplifying an input signal and having a conduction angle of at least about 180°, the amplifier circuit including an amplifying transistor and a dc bias circuit for biasing the amplifier transistor to obtain the desired conduction angle. The dc bias circuit includes a dynamic bias boosting circuit for increasing the dc bias current provided to the amplifying transistor by the dc bias circuit in direct proportion to an increase in the input signal provided to the power amplifier.

In a preferred embodiment of the invention, the amplifier circuit is either a Class B or a Class AB amplifier circuit.

In a further preferred embodiment of the invention, the dynamic bias boosting circuit includes a voltage-controlled current source controlled by a dc voltage proportional to the amplitude of the input signal provided to the power amplifier circuit.

In a further preferred embodiment of the invention, the power amplifier circuit also includes a driver transistor, and the dynamic bias boosting circuit senses a voltage proportional to a current in the driver transistor and increases the dc bias current provided to the amplifying transistor in direct proportion to an increase in the voltage to and current in the driver transistor.

A power amplifier circuit in accordance with the present invention offers a significant improvement in that a particularly advantageous combination of features, including increased maximum output power and reduced power dissipation at low power levels can be obtained in a simple, compact and economical configuration.

These and other aspects of the invention will be apparent from and elucidated with reference to the embodiments described hereinafter.

BRIEF DESCRIPTION OF THE DRAWING

The invention may be more completely understood with reference to the following description, to be read in conjunction with the accompanying drawing, in which.

In the drawing, like reference numerals are generally used to designate like components.

DESCRIPTION OF THE PREFERRED EMBODIMENTS

Figure 1:
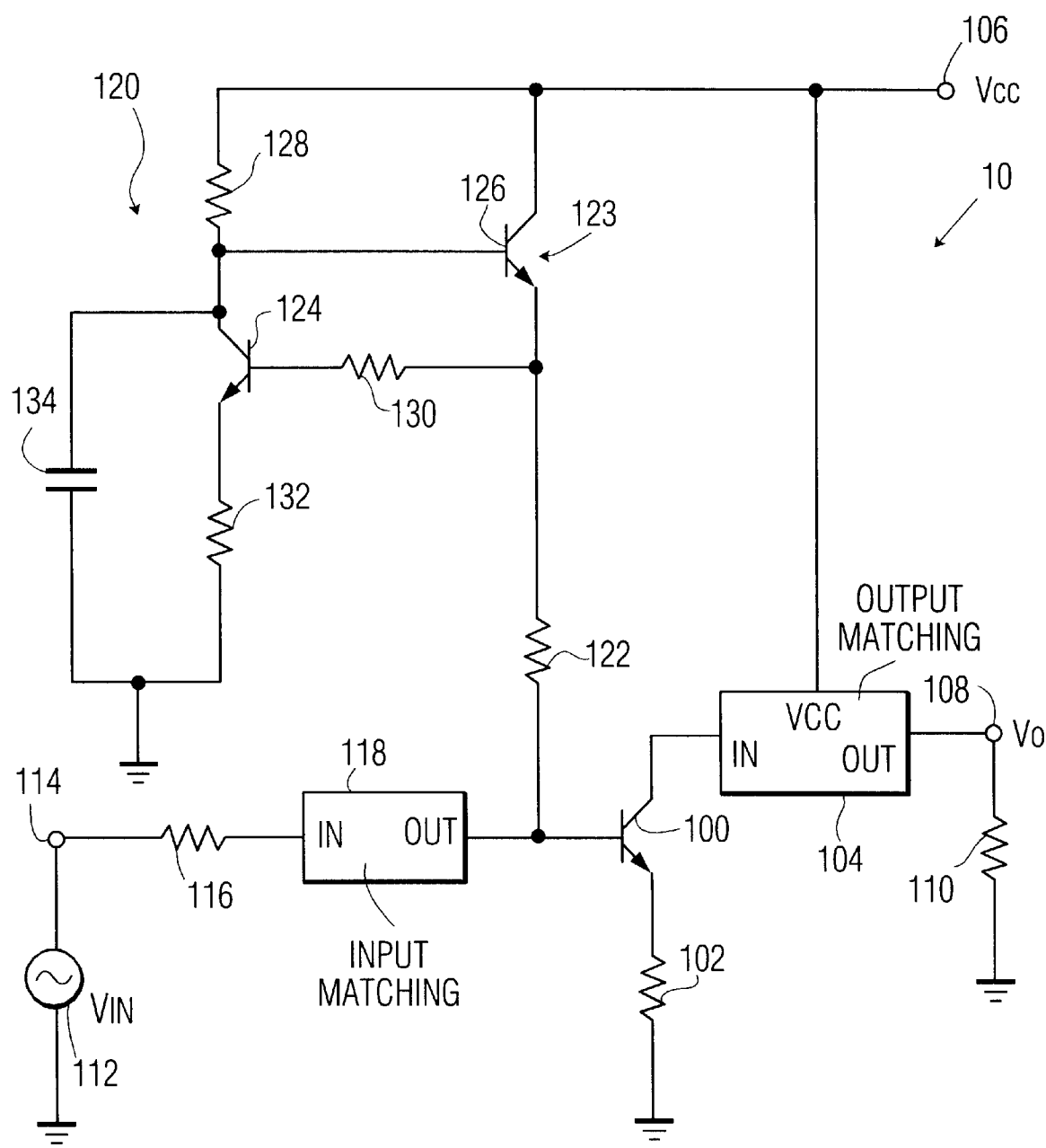
FIG. 1 shows a schematic diagram of a prior-art power amplifier.

An illustrative prior-art power amplifier, for example a Class AB RF amplifier into which the invention may be incorporated, is shown in simplified form in FIG. 1. Since this amplifier is of conventional form, it will be described in overview fashion with reference to its main components, with the understanding that the invention may be incorporated into an amplifier of the type shown or other amplifier circuits, such as Class B or Class AB RF or audio amplifiers.

Power amplifier 10 includes an amplifying transistor 100 having ballast resistance shown schematically by a ballast resistor 102. In practice, power transistors, and in particular RF power transistors, are usually fabricated in an interdigitated form, with a plurality of emitter elements. This can create hot-spotting and lead to thermal runaway in operation. In order to prevent thermal runaway, a ballast resistor is typically introduced in series with each emitter (or base) to divide the emitter current evenly among the emitter elements of the transistor, thus minimizing hot-spotting and the possibility of thermal runaway. In prior-art circuits such as the one shown in FIG. 1, this emitter (or base) resistance degrades the performance of the bias circuit at higher power levels, thus reducing maximum power output.

The collector output of transistor 100 is connected to the input terminal of an output matching circuit 104, which is provided with a voltage $V_{CC}$ from terminal 106 and provides an output signal Vo at terminal 108 across load resistor 110.

An input signal $V_{IN}$ is provided by a source 112 to input terminal 114, which is connected to the base of transistor 100 by an input resistor 116 and an input matching network 118.

The base of transistor 100 is also connected to a dc bias circuit 120 by a base biasing resistor 122. The dc bias circuit 120 is shown in this example as comprising a current mirror circuit 123 composed of transistors 124 and 126, resistors 128, 130 and 132, and capacitor 134, although it will be recognized that other forms of dc bias currents may be employed.

The problem that arises with prior-art circuits such as the one shown in FIG. 1 is that, in a Class AB amplifier, the average current drawn from the supply depends upon the input signal level. As the input signal level and power output increase, so do the average currents in both the emitter and the base of the power transistor 100. These increased average currents cause an increased voltage drop in the biasing circuitry, in particular in resistor R122, and also in the ballast resistor 102. This in turn reduces the conduction angle of the amplifier, pushing a Class AB amplifier deep into Class B operation or even into Class C operation, thus reducing the maximum power output by as much as 25%. In the prior art, this condition can be avoided by providing a larger bias to the amplifier, but this solution has the drawback that it entails a larger power dissipation at low output power levels.

Figure 2:
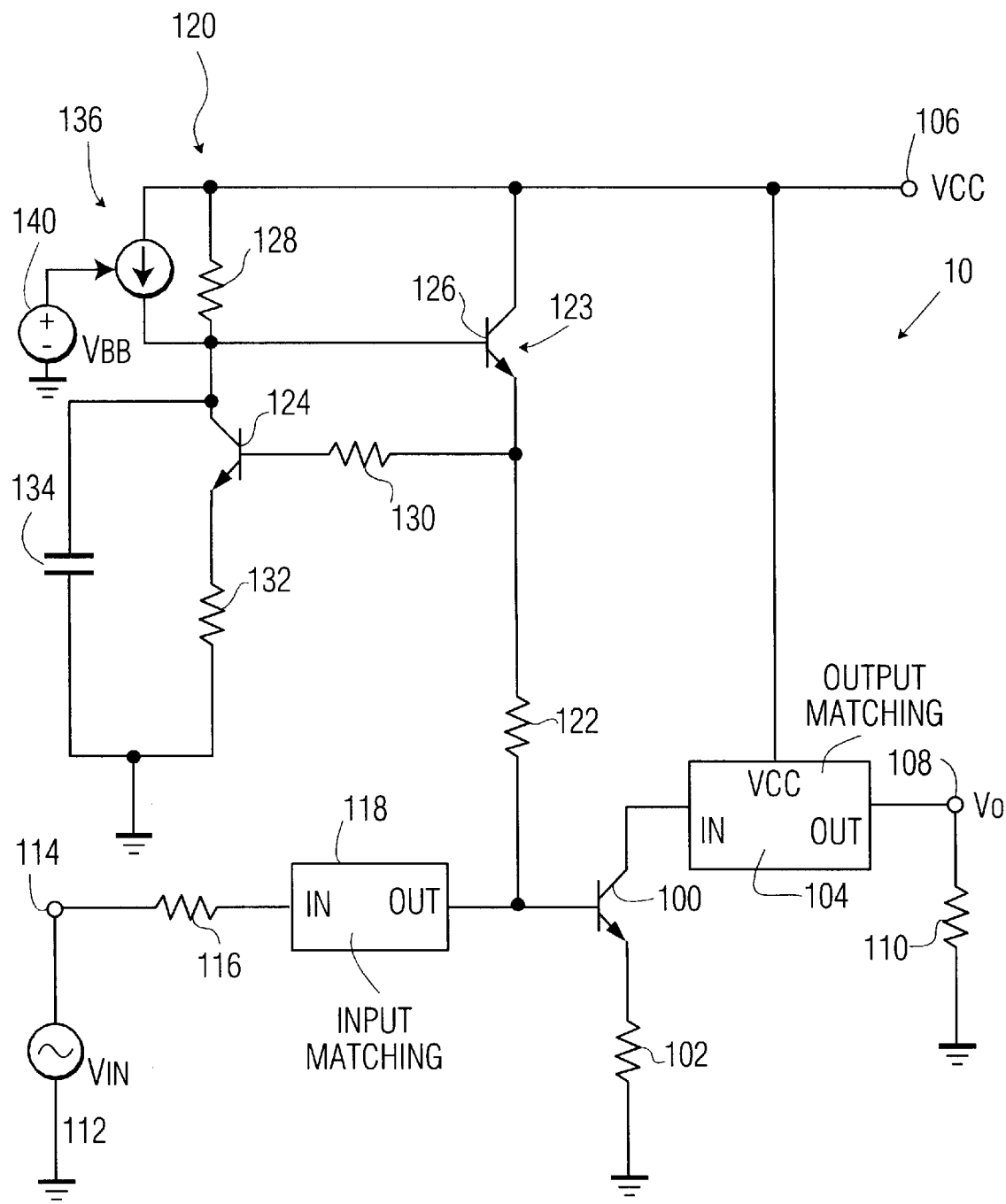
FIG. 2 shows a schematic diagram of a power amplifier circuit in accordance with a first embodiment of the invention.

FIG. 2 shows a power amplifier circuit in accordance with a first embodiment of the invention that overcomes the aforementioned drawbacks of the prior art, in that the power transistor is properly biased at both high and low signal levels to avoid reduction in maximum power output, while avoiding the necessity for a larger bias condition at low power levels, thus minimizing power dissipation at low power levels.

This improvement is accomplished by providing the power amplifier circuit with a dynamic bias boosting circuit which dynamically increases the bias of the power transistor as the output power increases.

In the power amplifier circuit of FIG. 2, a dynamic bias boosting circuit in accordance with a first embodiment of the invention is aided to the power amplifier circuit of FIG. 1 in order to achieve the aforementioned advantages. The dynamic bias boosting circuit 136 is shown in simplified, idealized form by a voltage-controlled current source 138 connected in parallel with resistor 128 and controlled by a dc voltage source 140 coupled to the voltage-controlled current source 138. The dc voltage source 140 serves to generate a bias-boosting voltage $V_{BB}$ with a value proportional to the amplitude of the input signal $V_{IN}$ at terminal 114. Thus, as the amplitude of the input signal $V_{IN}$ is increased, the value of the voltage $V_{BB}$ generated by the dc voltage source 140 is similarly increased, causing the dc current generated by voltage-controlled current source 138 to be increased to dynamically provide the extra dc bias current ultimately provided to the amplifier transistor 100. In this manner, the amplifier transistor 100 is able to generate maximum power output at high input signal levels, while the amplifier circuit maintains a low power dissipation at low power operating levels. As compared to the circuit of FIG. 1, with both circuits being biased for Class AB operation at low power levels, the circuit of FIG. 2 is capable of providing an approximately 25% increase in maximum output power without increasing power dissipation at low power levels.

Figure 3:
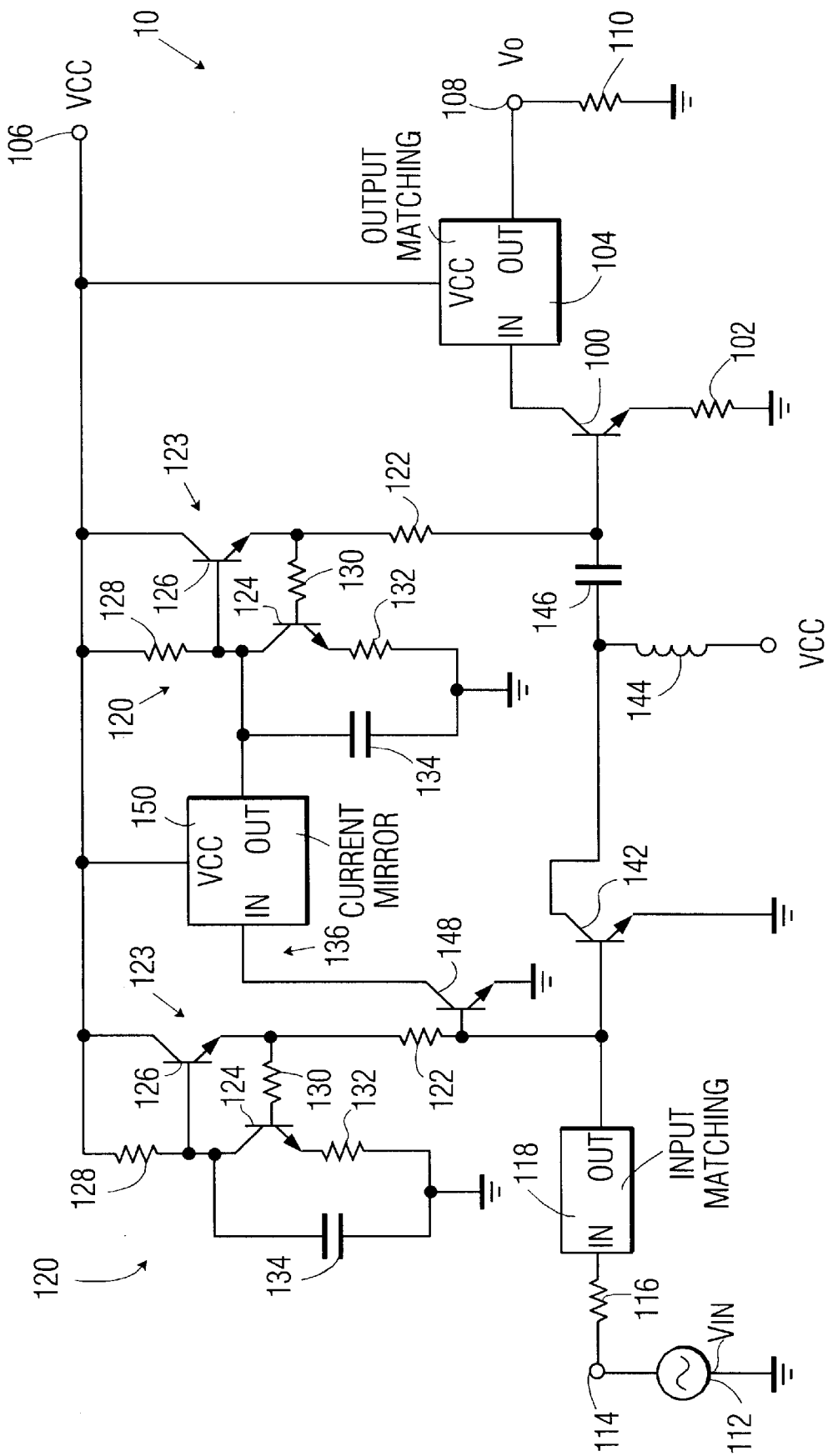
FIG. 3 shows a power amplifier circuit in accordance with a second embodiment of the invention.

A two-stage amplifier circuit containing the dynamic boosting circuit of the invention is shown in simplified schematic form in FIG. 3. It is to be understood that in the schematic diagram of FIG. 3, similarly-situated components and circuit portions, such as the dc bias circuits 120 for the two amplifier stages and the components thereof, are designated with like reference numerals for simplicity and are not further described.

The two-stage amplifier circuit of FIG. 3 includes an output stage comprising amplifying transistor 100, and also a driver stage comprising a driver transistor 142. Each stage is provided with a dc bias circuit 120 as previously described, and the driver transistor 142 is provided with collector voltage through an inductor 144 and has its output coupled to the input of power output transistor 100 through capacitor 146. Both the driver transistor 142 and the transistor 100 are biased for example in Class AB, by their respective dc bias circuits 120.

In this embodiment, the dynamic bias boosting function is provided by sensing transistor 148, which has its input connected in parallel with the input of driver transistor 142 in order to sense the voltage across and current in the driver transistor. Thus, as the input drive signal to driver transistor 142 increases, the current in the driver transistor 142 increases and the current in the sensing transistor 148 also increases. The output of sensing transistor 148 is provided to the input of a current mirror 150, which serves to average, scale and mirror the current provided by driver transistor 148 and to provide an output current which is added to the bias current provided by the dc bias circuit 120 of the power amplifier transistor 100. Current mirror 150 employs RC time constants and appropriately sized transistors to implement the averaging, scaling and mirroring functions in a conventional manner. Thus, sensing transistor 148 and current mirror 150 together perform the function of the voltage-controlled current source 136 by sensing the input voltage to driver transistor 142 (and therefore the current through the driver transistor 142) and the output of transistor 148 to generate a dynamic bias boosting current in current mirror 150 which is provided to the dc bias circuit 120 of the output transistor 100. In the two-stage embodiment shown in FIG. 3, the dynamic bias boosting circuit of the invention provides an increase in maximum output power of about 33%, while maintaining a low power dissipation at low power levels.

In this manner, the present invention provides a power amplifier circuit suitable for use in RF or audio amplifiers which has a bias boosting circuit which permits the amplifier circuit to operate with improved maximum power output and less power dissipation at low power levels. Additionally, the present invention provides a power amplifier circuit which is both simple and compact in design and which is economical to manufacture.

While the invention has been particularly shown and described with reference to several preferred embodiments thereof, it will be understood by those skilled in the art that various changes in form and detail may be made without departing from the spirit and scope of the invention. Thus, for example, different types of transistors, dc bias circuits, and driver and power output stages may be employed as appropriate, and alterations to the circuit configuration may be made to suit particular design requirements.

What is claimed is:

1. A power amplifier circuit for amplifying an input signal and having a conduction angle of at least about 180°, said power amplifier circuit comprising an amplifying transistor and a dc bias circuit for biasing said amplifying transistor to obtain said conduction angle, and said dc bias circuit comprising a dynamic bias boosting circuit for increasing a dc bias current provided to said amplifying transistor by said dc bias circuit in direct proportion to an increase in said input signal provided to said power amplifier circuit.

2. A power amplifier circuit as in claim 1, wherein said amplifier circuit is a Class B amplifier circuit.

3. A power amplifier circuit as in claim 1, wherein said amplifier circuit is a Class AB amplifier circuit.

4. A power amplifier circuit as in claim 1, wherein said dynamic bias boosting circuit comprises a voltage-controlled current source controlled by a dc voltage proportional to an amplitude of said input signal.

5. A power amplifier circuit as claimed in claim 1, further comprising a driver transistor, wherein said dynamic bias boosting circuit comprises means for sensing a voltage proportional to a current in said driver transistor and for increasing said dc bias current provided to said amplifying transistor in direct proportion to an increase in the current in said driver transistor.

* * * * *